(12) United States Patent
Campbell et al.

(10) Patent No.: US 7,289,349 B2
(45) Date of Patent: Oct. 30, 2007

(54) RESISTANCE VARIABLE MEMORY ELEMENT WITH THRESHOLD DEVICE AND METHOD OF FORMING THE SAME

(75) Inventors: Kristy A. Campbell, Boise, ID (US); Jon Daley, Boise, ID (US); Joseph F. Brooks, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/601,747

(22) Filed: Nov. 20, 2006

(65) Prior Publication Data

US 2007/0064474 A1 Mar. 22, 2007

Related U.S. Application Data

(62) Division of application No. 11/214,991, filed on Aug. 31, 2005.

(51) Int. Cl.
*G11C 7/00* (2006.01)
(52) U.S. Cl. ........................ 365/105; 365/148
(58) Field of Classification Search ................ 365/105, 365/148, 171
See application file for complete search history.

(56) References Cited

U.S. PATENT DOCUMENTS

| | | | |
|---|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |

(Continued)

FOREIGN PATENT DOCUMENTS

JP 5-6126916 10/1981

(Continued)

OTHER PUBLICATIONS

U.S. Appl. No. 10/916,421, filed Aug. 2004, Campbell.

(Continued)

*Primary Examiner*—Vu A. Le
(74) *Attorney, Agent, or Firm*—Dickstein Shapiro LLP

(57) ABSTRACT

A memory device having a memory portion connected in series with a threshold device between. The memory portion stores at least one bit of data based on at least two resistance states. The threshold device is configured to switch from a high resistance state to a low resistance state upon application of a voltage and, when the voltage is removed, to re-assume the high resistance state. Additionally, the threshold device can be configured to switch in response to both negative and positive applied voltages across the first and second electrodes. Memory elements having a memory portion and threshold device between first and second electrodes and methods for forming the memory elements are also provided.

21 Claims, 6 Drawing Sheets

U.S. PATENT DOCUMENTS

| | | |
|---|---|---|
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |

| | | | |
|---|---|---|---|
| 6,714,954 | B2 | 3/2004 | Ovshinsky et al. |
| 6,937,528 | B2 * | 8/2005 | Hush et al. ............ 365/189.07 |
| 2002/0000666 | A1 | 1/2002 | Kozicki et al. |
| 2002/0072188 | A1 | 6/2002 | Gilton |
| 2002/0106849 | A1 | 8/2002 | Moore |
| 2002/0123169 | A1 | 9/2002 | Moore et al. |
| 2002/0123170 | A1 | 9/2002 | Moore et al. |
| 2002/0123248 | A1 | 9/2002 | Moore et al. |
| 2002/0127886 | A1 | 9/2002 | Moore et al. |
| 2002/0132417 | A1 | 9/2002 | Li |
| 2002/0160551 | A1 | 10/2002 | Harshfield |
| 2002/0163828 | A1 | 11/2002 | Krieger et al. |
| 2002/0168820 | A1 | 11/2002 | Kozicki |
| 2002/0168852 | A1 | 11/2002 | Kozicki |
| 2002/0190289 | A1 | 12/2002 | Harshfield et al. |
| 2002/0190350 | A1 | 12/2002 | Kozicki et al. |
| 2003/0001229 | A1 | 1/2003 | Moore et al. |
| 2003/0027416 | A1 | 2/2003 | Moore |
| 2003/0032254 | A1 | 2/2003 | Gilton |
| 2003/0035314 | A1 | 2/2003 | Kozicki |
| 2003/0035315 | A1 | 2/2003 | Kozicki |
| 2003/0038301 | A1 | 2/2003 | Moore |
| 2003/0043631 | A1 | 3/2003 | Gilton et al. |
| 2003/0045049 | A1 | 3/2003 | Campbell et al. |
| 2003/0045054 | A1 | 3/2003 | Campbell et al. |
| 2003/0047765 | A1 | 3/2003 | Campbell |
| 2003/0047772 | A1 | 3/2003 | Li |
| 2003/0047773 | A1 | 3/2003 | Li |
| 2003/0048519 | A1 | 3/2003 | Kozicki |
| 2003/0048744 | A1 | 3/2003 | Ovshinsky et al. |
| 2003/0049912 | A1 | 3/2003 | Campbell et al. |
| 2003/0068861 | A1 | 4/2003 | Li et al. |
| 2003/0068862 | A1 | 4/2003 | Li et al. |
| 2003/0095426 | A1 | 5/2003 | Hush et al. |
| 2003/0096497 | A1 | 5/2003 | Moore et al. |
| 2003/0107105 | A1 | 6/2003 | Kozicki |
| 2003/0117831 | A1 | 6/2003 | Hush |
| 2003/0128612 | A1 | 7/2003 | Moore et al. |
| 2003/0137869 | A1 | 7/2003 | Kozicki |
| 2003/0143782 | A1 | 7/2003 | Gilton et al. |
| 2003/0155589 | A1 | 8/2003 | Campbell et al. |
| 2003/0155606 | A1 | 8/2003 | Campbell et al. |
| 2003/0156447 | A1 | 8/2003 | Kozicki |
| 2003/0156463 | A1 | 8/2003 | Casper et al. |
| 2003/0209728 | A1 | 11/2003 | Kozicki et al. |
| 2003/0209971 | A1 | 11/2003 | Kozicki et al. |
| 2003/0210564 | A1 | 11/2003 | Kozicki et al. |
| 2003/0212724 | A1 | 11/2003 | Ovshinsky et al. |
| 2003/0212725 | A1 | 11/2003 | Ovshinsky et al. |
| 2004/0035401 | A1 | 2/2004 | Ramachandran et al. |

FOREIGN PATENT DOCUMENTS

| | | |
|---|---|---|
| WO | WO97/48032 | 12/1997 |
| WO | WO99/28914 | 6/1999 |
| WO | WO 00/48196 | 8/2000 |
| WO | WO 02/21542 | 3/2002 |

OTHER PUBLICATIONS

U.S. Appl. No. 10/893,299, filed Jul. 2004, Campbell.

Abdel-All, A.; Elshafie,A.; Elhawary, M.M., DC Electric-field Effect in Bulk and Thin-film Ge5As38Te57 Chalcogenide Glass, Vacuum 59 (2000) 845-853.

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se5Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell* (PMC), pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S-to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) 17th (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L. , Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Deamaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Disstertation: *Materials Characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1-x Around the Stiffness Threshold Composition, J. Optoelectronics and Advanced Materials 3 (2001) 199-214.

Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3-Ag2S, GeS2-GeS-Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x (0<=x<=0.571) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. App. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1-x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metallurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x$ ($0 \leq x \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., The Photo-Erasable Memory Switching Effect of Ag Photo-Doped Chalcogenide Glasses, 46 B. Chem. Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Titus, S.S.K.; Chatterjee, R.; Asokan, S., Electrical Switching and Short-range Order in As-Te Glasses, Phys, Rev. B 48 (1993) 14650-14652.

Tranchant,S.;Peytavin,S.;Ribes,M.;Flank,A.M.;Dexpert,H.;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov, S.; Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2.4), J. Non-Cryst. Solids 151 (1992) 149-154.

* cited by examiner

RESISTANCE VARIABLE MEMORY ELEMENT WITH THRESHOLD DEVICE AND METHOD OF FORMING THE SAME

This application is a divisional application of U.S. application Ser. No. 11/214,991, filed Aug. 31, 2005, the content of which is incorporated herein by reference.

FIELD OF THE INVENTION

The invention relates to the field of random access memory (RAM) devices formed using a resistance variable material.

BACKGROUND OF THE INVENTION

Resistance variable memory elements, which include electrokinetic memory elements using chalcogenides, have been investigated for suitability as semi-volatile and non-volatile random access memory devices. A representative chalcogenide resistance variable memory element is disclosed in U.S. Pat. No. 6,348,365 to Moore and Gilton.

In one type of chalcogenide resistance variable memory element, a conductive material, for example, silver and copper, is incorporated into a chalcogenide glass. The resistance of the chalcogenide glass can be programmed to stable higher resistance and lower resistance states. An unprogrammed chalcogenide variable resistance element is normally in a higher resistance state. A write operation programs the element to a lower resistance state by applying a voltage potential across the chalcogenide glass and forming a conductive pathway. The element may then be read by applying a voltage pulse of a lesser magnitude than required to program it; the resistance across the memory device is then sensed as higher or lower to define two logic states.

The programmed lower resistance state of a chalcogenide variable resistance element can remain intact for an indefinite period, typically ranging from hours to weeks, after the voltage potentials are removed; however, some refreshing may be useful. The element can be returned to its higher resistance state by applying a reverse voltage potential of about the same order of magnitude as used to write the device to the lower resistance state. Again, the higher resistance state is maintained in a semi-or non-volatile manner once the voltage potential is removed. In this way, such an element can function as a semi-or non-volatile variable resistance memory having at least two resistance states, which can define two respective logic states, i.e., at least a bit of data.

One exemplary chalcogenide resistance variable device uses a germanium selenide (i.e., $Ge_xSe_{100-x}$) chalcogenide glass as a backbone between first and second electrodes. The germanium selenide glass has, in the prior art, incorporated silver (Ag) and silver selenide ($Ag_{2+/-x}Se$) layers in the memory element. The element is programmed by applying a sufficient voltage across the electrodes to cause the formation of a conductive path between the two electrodes, by virtue of a conductor (i.e., such as silver) that is present in metal ion laced glass layer.

It would be desirable to have a structure and method for adjusting the programming voltages used for a memory element.

BRIEF SUMMARY OF THE INVENTION

Embodiments of the invention include memory devices having a memory portion connected in series with a threshold device between the electrodes is provided. The memory portion stores at least one bit of data based on at least two resistance states. The threshold device is configured to switch from a high resistance state to a low resistance state upon application of a voltage and, when the voltage is removed, to re-assume the high resistance state. Additionally, the threshold device can be configured to switch in response to both negative and positive applied voltages across the first and second electrodes. Embodiments of the invention also include memory elements having a memory portion and threshold device between first and second electrodes. Methods for forming the memory elements are also provided.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

Figure 1:
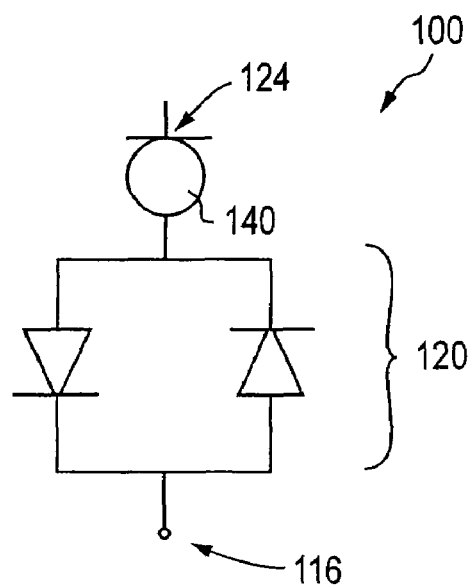
FIG. 1 illustrates a schematic diagram of a memory element according to the invention.

The invention is now explained with reference to the figures, which illustrate exemplary embodiments and throughout which like reference numbers indicate like features. FIG. 1 is a schematic diagram of the memory element 100 according to the invention. A threshold device 120 is connected in series with the memory portion 140 of the memory element 100. Specifically, in FIG. 1, the threshold device 120 is disposed between a first electrode 116 and a second electrode 124 of the element 100. Schematically, the threshold device 120 is depicted by two diodes in parallel with opposite orientations.

The threshold device 120 is configured to have a switching characteristic with respect to both a positive and negative voltage, such that the memory portion 140 of the element 100 can be written and erased when the positive and negative voltages are applied. Upon application of a positive or negative voltage, the threshold device 120 switches from a high resistance state to a stable low resistance state so that the voltage drop across the threshold device 120 is constant. When the positive or negative voltage is removed, the threshold device 120 re-assumes the high resistance state. Preferably, the threshold device 120 does not exhibit any leakage current.

By placing the threshold device 120 in series with the memory portion 140 of the memory element 100, it is possible to use a voltage with a greater magnitude to program (i.e., write and erase) the memory portion 140. For example, if the threshold device 120 has a threshold voltage greater than the voltage needed to write the memory portion 140 to a high or low resistance state, the threshold device 120 would effectively cause an increase in the voltage magnitude needed to write the memory portion 140. The programming voltage can thus be increased up to about 1 to 2 Volts or more. Additionally, the threshold device 120 can protect the memory portion 140 from spurious noise, since a voltage of a greater magnitude will be needed to write the memory portion 140.

According to an exemplary embodiment, the threshold voltage of the threshold device 120 has a greater magnitude in one of the positive or negative directions. For example, where an increase in the write voltage in the positive direction is desired, the voltage of the threshold device 120 is greater in the positive direction and the memory portion is read using a negative voltage. The magnitude of the threshold voltage of the threshold device 120 is sufficiently low in the negative direction to allow the memory portion 140 to be read without causing the resistance state of the memory portion 140 to be changed. Similarly, where an increase in the write voltage in the negative direction is desired, the voltage of the threshold device 120 can be greater in the negative direction and the memory portion can be read using a positive voltage.

According to an exemplary embodiment of the invention, the threshold device 120 is one or more layers of material. The material or materials selected for the threshold device 120 are preferably configurable to be responsive to both a positive and negative voltage. Alternatively, if a material or set of materials is responsive to only one voltage type (e.g., positive), a pair of the materials or material sets arranged in opposite orientation may be used to achieve a threshold device 120 responsive to both a positive and negative switching voltage, as schematically depicted in FIG. 1.

Figure 2:
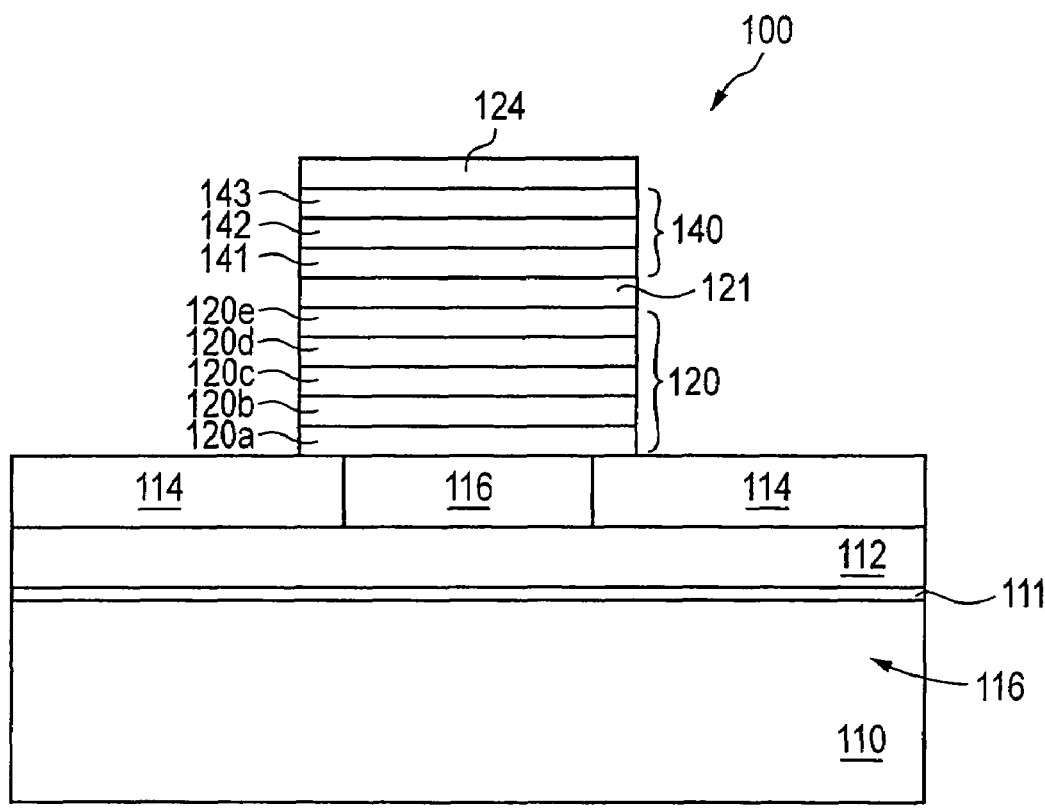
FIG. 2 illustrates a cross sectional view of a portion of a memory element according to an exemplary embodiment of the invention.

FIG. 2 illustrates a cross-sectional view of the memory element 100 according to an exemplary embodiment of the invention. The element 100 shown in FIG. 2 is supported by a substrate 110. Over the substrate 110, though not necessarily directly so, is a conductive address line 112, which serves as an interconnect for the element 100 shown and a plurality of other similar devices of a portion of a memory array of which the shown element 100 is a part. It is possible to incorporate an optional insulating layer 111 between the substrate 110 and address line 112, and this may be preferred if the substrate 110 is semiconductor-based. The conductive address line 112 can be any material known in the art as being useful for providing an interconnect line, such as doped polysilicon, silver (Ag), gold (Au), copper (Cu), tungsten (W), nickel (Ni), aluminum (Al), platinum (Pt), titanium (Ti), and other materials. Over the address line 112 is a first electrode 116, which is defined within an insulating layer 114, which is also over the address line 112. This electrode 116 can be any conductive material that will not migrate into the layer formed directly over the electrode 116 (e.g., layer 120a, described below), but is preferably tungsten (W). The insulating layer 114 can be, for example, silicon nitride ($Si_3N_4$), a low dielectric constant material, an insulating glass, or an insulating polymer, but is not limited to such materials.

In the embodiment shown in FIGS. 1 and 2, the threshold device 120 is formed over the first electrode 116. In the illustrated embodiment, the threshold device 120 is a stack of layers 120a, 120b, 120c, 120d, 120e. For simplicity, in certain figures, the individual component layers of the threshold device 120 are not shown. Layers 120a, 120c and 120e are each a chalcogenide material, for example, germanium selenide ($Ge_xSe_{100-x}$), and more particularly $Ge_{60}Se_{40}$. Layers 120a, 120c and 120e may be a same chalcogenide material and may have the same stoichiometry, but may also be different. Layer 120b is a metal-chalcogenide layer, and in the illustrated embodiment is tin-selenide. Layer 120d is a metal layer and in the illustrated embodiment is copper. The threshold device 120, however, can include additional layers and/or different materials, which are configured as described above.

An optional conductive layer 121 is formed over the threshold device 120. The conductive layer 121 can be any suitable conductive material, and in the illustrated embodiment is tungsten.

The memory portion 140 (i.e., the portion for storing a bit of data based on at least two resistance states, which can define two respective logic states) of the memory element 100 is formed over the optional conductive layer 121. The memory portion 140 includes one or more layers of resistance variable material and can further include one or more layers of other materials such as, for example, metal. In the illustrated embodiment, the memory portion 140 is a stack of layers and includes, for example, a chalcogenide material layer 141, a tin-chalcogenide layer 142, and an optional metal layer 143. For simplicity, in certain figures the individual component layers of the memory portion 140 are not shown. The invention, however, is not limited to such embodiments, and the memory portion 140 can include additional or fewer layers of other materials suitable for forming a resistance variable memory element. For example, the portion 140 can include a second chalcogenide material layer (not shown) over the metal layer 143. The second chalcogenide layer may be a same material as the chalcogenide layer 141 or a different material.

In the illustrated embodiments, the chalcogenide material layer 141 is e.g., germanium selenide ($Ge_xSe_{100-x}$). The germanium selenide may be within a stoichiometric range of about $Ge_{33}Se_{67}$ to about $Ge_{60}Se_{40}$. The chalcogenide material layer 141 may be between about 100 Å and about 1000 Å thick, e.g., about 300 Å thick. Layer 141 need not be a single layer, but may also be comprised of multiple chalcogenide sub-layers having the same or different stoichiometries.

Over the chalcogenide material layer 141 is an optional layer of metal-chalcogenide 142, such as tin-chalcogenide (e.g., tin selenide ($Sn_{1+/-x}Se$, where x is between about 1 and about 0)), or silver-chalcogenide (e.g., silver selenide). It is also possible that other chalcogenide materials may be substituted for selenium, such as sulfur, oxygen, or tellurium. The layer 142 in the exemplary embodiment is a layer of tin-chalcogenide layer and may be about 100 Å to about 1000 Å thick; however, its thickness depends, in part, on the thickness of the underlying chalcogenide material layer 141. The ratio of the thickness of the tin-chalcogenide layer 142 to that of the underlying chalcogenide material layer 141 is preferably between about 5:1 and about 1:3.

An optional metal layer 143 is provided over the tin-chalcogenide layer 142, with silver (Ag) being the exemplary metal. This metal layer 143 is between about 300 Å and about 500 Å thick. Over the metal layer 143 is the second electrode 124. The second electrode 124 can be made of the same material as the first electrode 116, but is not required to be so formed. In the illustrated embodiment, the second electrode 124 is tungsten (W).

FIGS. 3A-3D are cross sectional views of a wafer in various stages of fabrication depicting the formation of the memory element 100 according to an exemplary embodiment of the invention. No particular order is required for any of the actions described herein, except for those logically requiring the results of prior actions. Accordingly, while the actions below are described as being performed in a general order, the order is exemplary only and can be altered if desired. Although the formation of a single memory element 100 is shown, it should be appreciated that the memory element 100 can be one memory element in an array of memory elements, which can be formed concurrently.

Figure 3A:
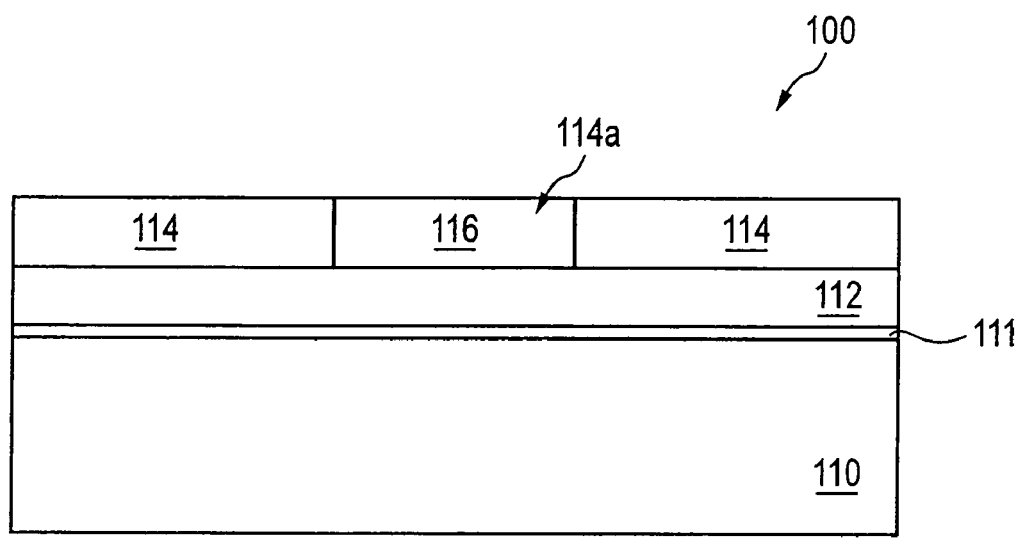
FIGS. 3A-3D depict the formation of the memory element of FIG. 2 at different stages of processing.

As shown by FIG. 3A, a substrate 110 is initially provided. As indicated above, the substrate 110 can be semiconductor-based or another material useful as a supporting structure. If desired, an optional insulating layer 111 may be formed over the substrate 110. The optional insulating layer 111 may be silicon oxide, silicon nitride, or other insulating materials. Over the substrate 110 (and optional insulating layer 111, if desired), the conductive address line 112 is formed by depositing a conductive material, such as doped polysilicon, aluminum, platinum, silver, gold, nickel, titanium, but preferably tungsten. The conductive material is patterned, for instance with photolithographic techniques, and etched to define the address line 112. The conductive material may be deposited by any technique known in the art, such as sputtering, chemical vapor deposition, plasma enhanced chemical vapor deposition, evaporation, or plating.

An insulating layer 114 is formed over the address line 112. The insulating layer 114 can be silicon nitride, a low dielectric constant material, or other insulators known in the art, and may be formed by any known method. Preferably, the insulating layer 114 (e.g., silicon nitride) does not allow tin ion migration. An opening 114a in the insulating layer 114 is made, for instance by photolithographic and etching techniques, exposing a portion of the underlying address line 112. A first electrode 116 is formed within the opening 114a, by forming a layer of conductive material over the insulating layer 114 and in the opening 114a. A chemical mechanical polishing (CMP) step is performed to remove the conductive material from over the insulating layer 114. Desirably, the first electrode 116 is formed of tungsten.

Figure 3B:
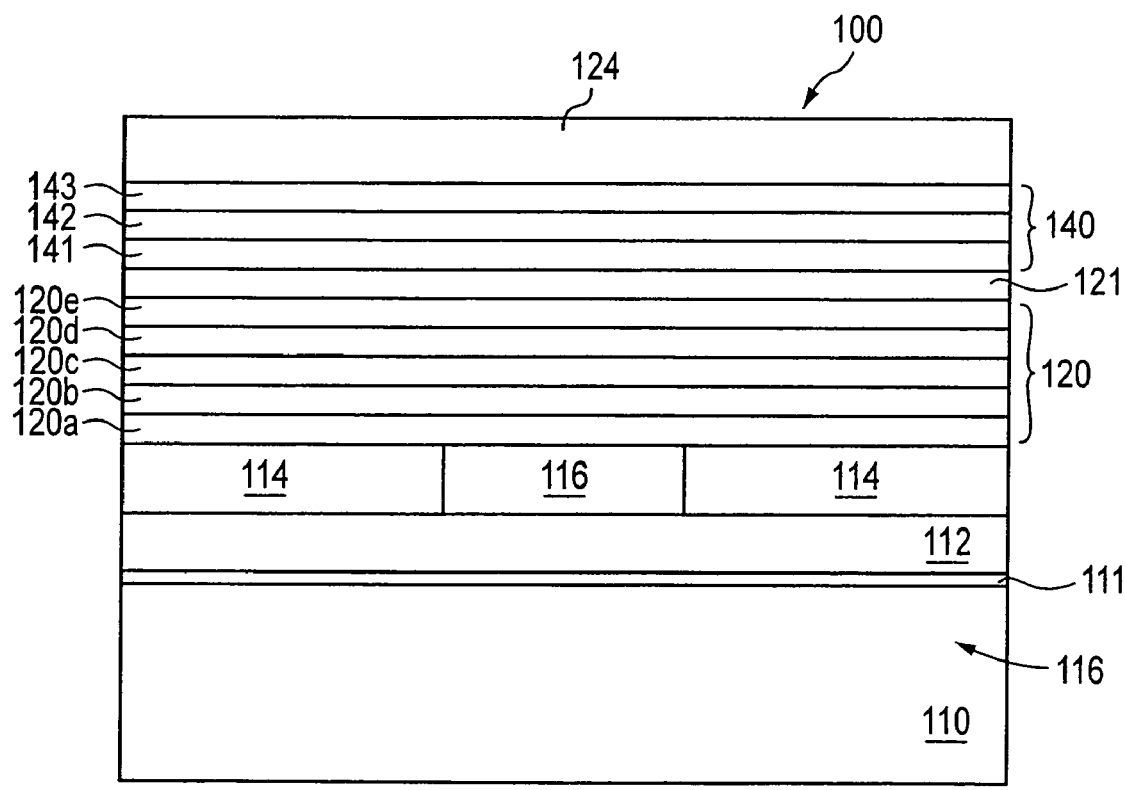

As shown in FIG. 3B, the threshold device 120 is formed over the first electrode 116 and insulating layer 114. In the illustrated embodiment, layer 120a is formed over the first electrode 116 and insulating layer 114, and each of the layers 120b, 120c, 120d, 120e of the threshold device 120 is formed consecutively thereafter. Layers 120a, 120c and 120e are each a chalcogenide material, for example, germanium selenide ($Ge_xSe_{100-x}$), and more particularly $Ge_{60}Se_{40}$. Layers 120a, 120c and 120e may be a same chalcogenide material and may have the same stoichiometry, but may also be different. Formation of the layers 120a, 120c and 120e of the threshold device 120 may be accomplished by any suitable method, for example, by sputtering. Layer 120b is a metal-chalcogenide layer, and in the illustrated embodiment is tin-selenide. Layer 120b can be formed by any suitable method, e.g., physical vapor deposition, chemical vapor deposition, co-evaporation, sputtering, among other techniques. Layer 120d is a metal layer and in the illustrated embodiment is copper and can be formed by any suitable technique.

An optional conductive layer 121 is formed over the threshold device 120. The conductive layer 121 can be any suitable conductive material and can be formed by any suitable technique. In the illustrated embodiment the conductive layer 121 is copper.

The memory portion 140 of the memory element 100 is formed over the optional conductive layer 121. In the illustrated embodiment, the memory portion 140 is a stack of layers and includes, for example, a chalcogenide material layer 141, a tin-chalcogenide layer 142, and an optional metal layer 143. In the illustrated embodiments, the chalcogenide material layer 141 is e.g., germanium selenide ($Ge_xSe_{100-x}$). The germanium selenide may be within a stoichiometric range of about $Ge_{33}Se_{67}$ to about $Ge_{60}Se_{40}$. The chalcogenide material layer 141 is formed to between about 100 Å and about 1000 Å thick, e.g., about 300 Å thick. Layer 141 need not be a single layer, but may also be formed to include multiple chalcogenide sub-layers having the same or different stoichiometries.

An optional layer of metal-chalcogenide 142, such as tin-chalcogenide (e.g., tin selenide ($Sn_{1+/-x}Se$, where x is between about 1 and about 0)), or silver-chalcogenide (e.g., silver selenide) is formed over the chalcogenide material layer 141. The metal-chalcogenide layer 142 can be formed by any suitable method, e.g., physical vapor deposition, chemical vapor deposition, co-evaporation, sputtering, among other techniques. It is also possible that other chalcogenide materials may be substituted for selenium, such as sulfur, oxygen, or tellurium. The layer 142 in the exemplary embodiment is a layer of tin-chalcogenide layer and is formed to be about 100 Å to about 1000 Å thick; however, its thickness depends, in part, on the thickness of the underlying chalcogenide material layer 141. The chalcogenide material layer 141 and tin-chalcogenide layer 142 are preferably formed such that the ratio of the thickness of the tin-chalcogenide layer 142 to that of the underlying chalcogenide material layer 141 is between about 5:1 and about 1:3.

An optional metal layer 143 is formed by any suitable technique over the tin-chalcogenide layer 142, with silver (Ag) being the exemplary metal. This metal layer 143 formed to be between about 300 Å and about 500 Å thick.

A conductive material is deposited over the metal layer 143 to form a second electrode 124. Similar to the first electrode 116, the conductive material for the second electrode 124 may be any material suitable for a conductive electrode. In one exemplary embodiment the second electrode 124 is tungsten.

Figure 3C:
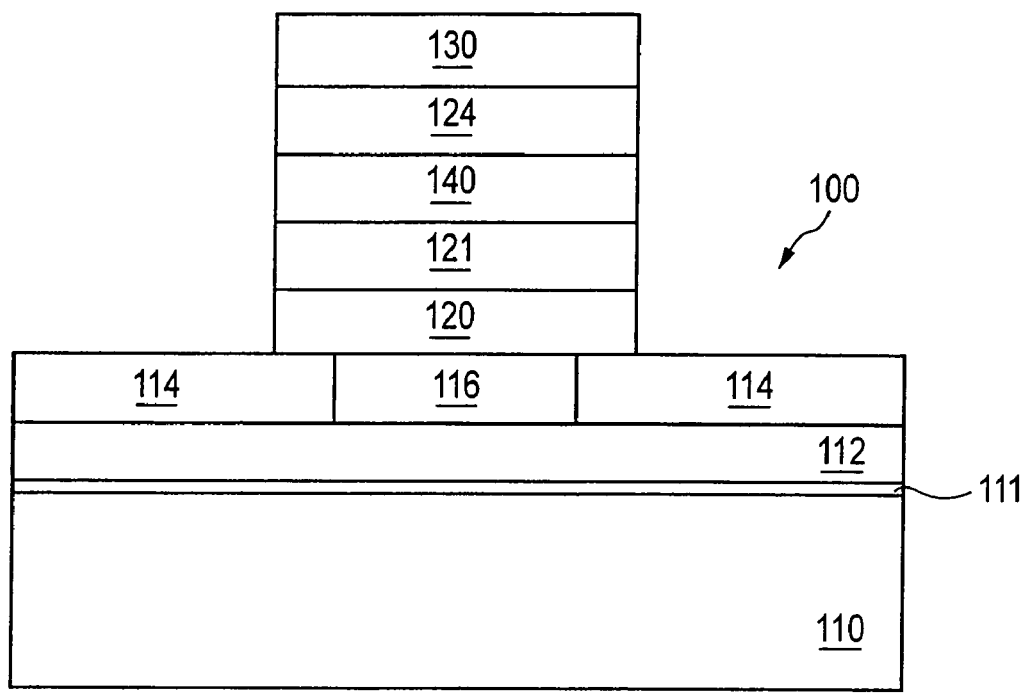
Figure 3D:
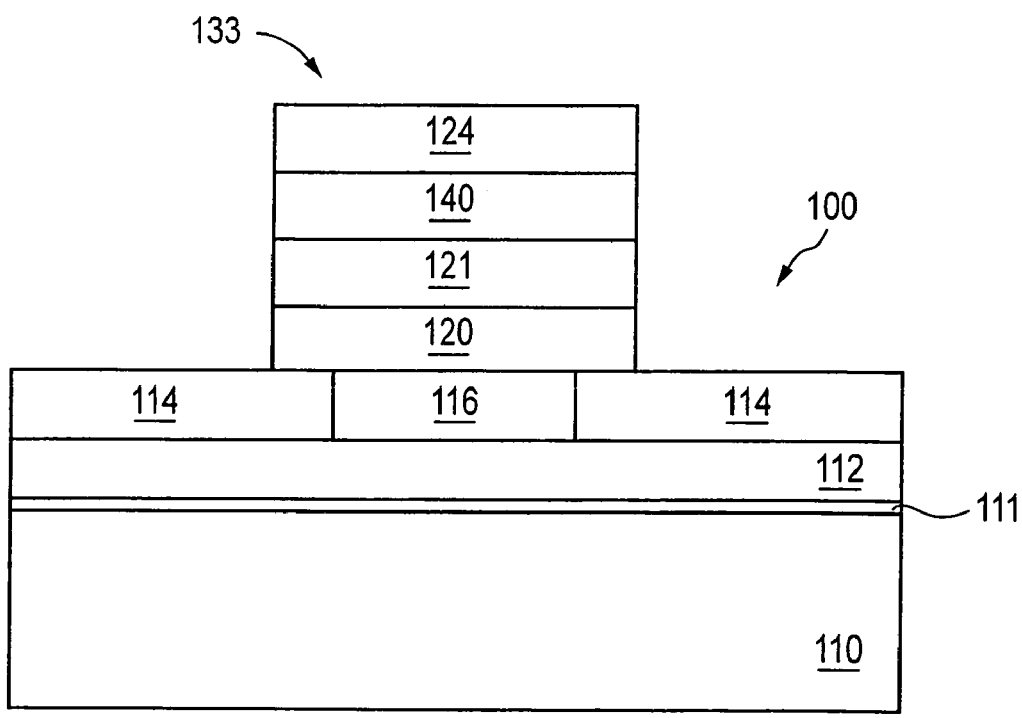

Referring to FIG. 3C, a layer of photoresist 130 is deposited over the second electrode 124 layer, masked and patterned to define a stack 133 of the memory element 100. An etching step is used to remove portions of layers 120 (120a, 120b, 120c, 120d, 120e), 121, 141, 142, 142, and electrode 124, with the insulating layer 114 used as an etch stop, leaving stack 133 as shown in FIG. 3C. The photoresist 130 is removed, leaving the structure shown in FIG. 3D.

Additional steps may be performed to isolate the memory element 100 from other memory elements and other devices. For example, an insulating layer (not shown) may be formed over the stack 133 of layers 120 (120a, 120b, 120c, 120d, 120e), 121, 141, 142, 142, and electrode 124. Also, other processing steps can be conducted to electrically couple the element 100 to peripheral circuitry (not shown) and to include the element 100 in an array of memory element, and include such an array in an integrated circuit or processor system, e.g., processor system 600 described below in connection with FIG. 6.

Figure 4:
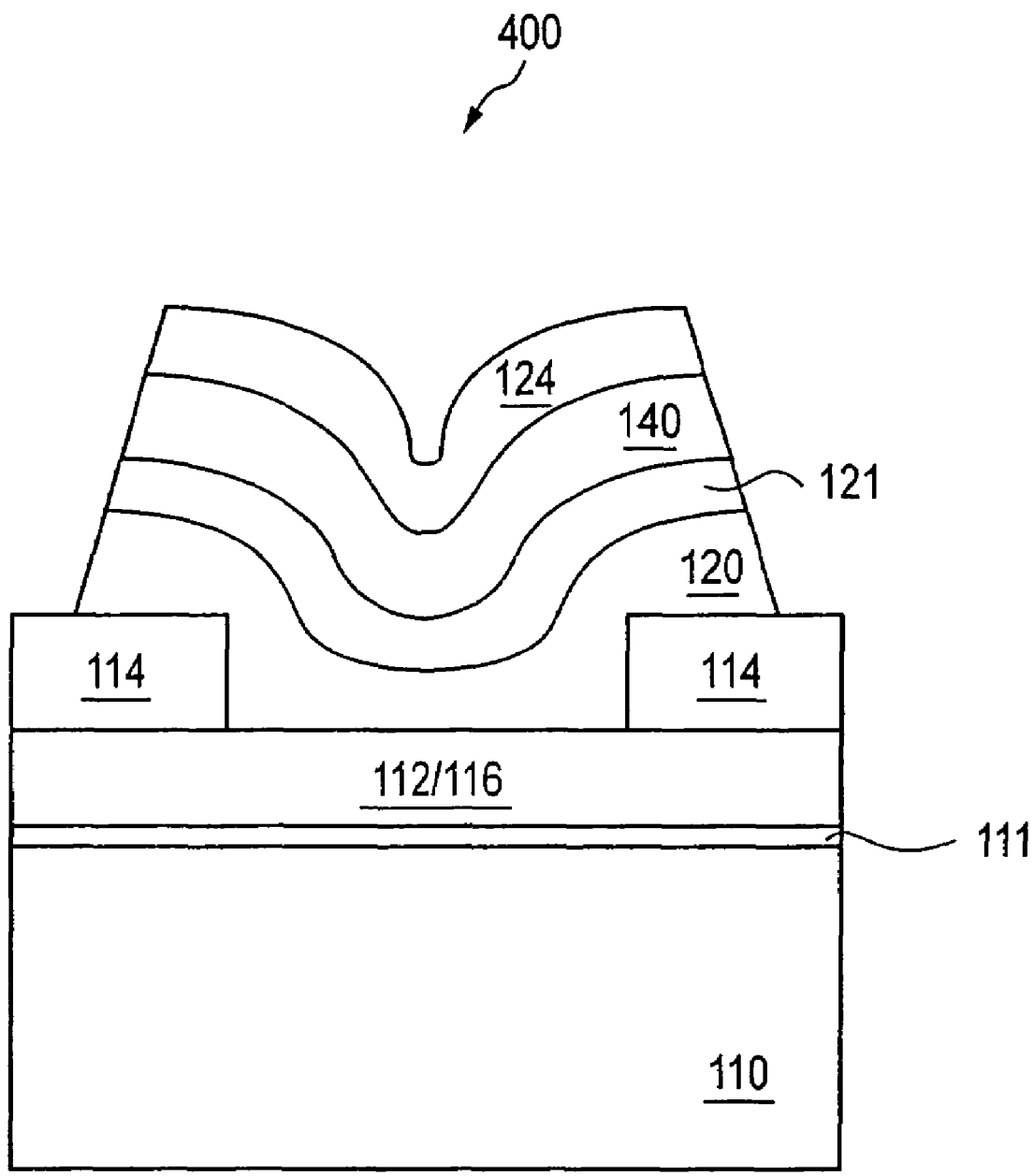
FIG. 4 illustrates a cross sectional view of a portion of a memory element according to another exemplary embodiment of the invention.

FIG. 4 illustrates a memory element 400 according to another exemplary embodiment of the invention. In the illustrated memory element 400, the chalcogenide material (or germanium), tin-chalcogenide, and optional metal layers 120 (120a, 120b, 120c, 120d, 120e), 121, 141, 142, 142, and electrode 124 are formed in a via 128. The via 128 is formed in an insulating layer 114 over a combined address line and electrode structure 112/116. Layers 120 (120a, 120b, 120c, 120d, 120e), 121, 141, 142, 142, as well as the second electrode 124, are conformally deposited over the insulating layer 114 and within the via 128. Layers 120, 121, 141, 142, 142, and electrode 124 are patterned to define a stack over the via 128, which is etched to form the completed memory element 400. Alternatively, a first electrode 116 that is separate from the underlying address line 112 can be used. Such a separate electrode 116 can be formed in the via 128 prior to the formation of layers 120, 121, 141, 142, 142.

Figure 5:
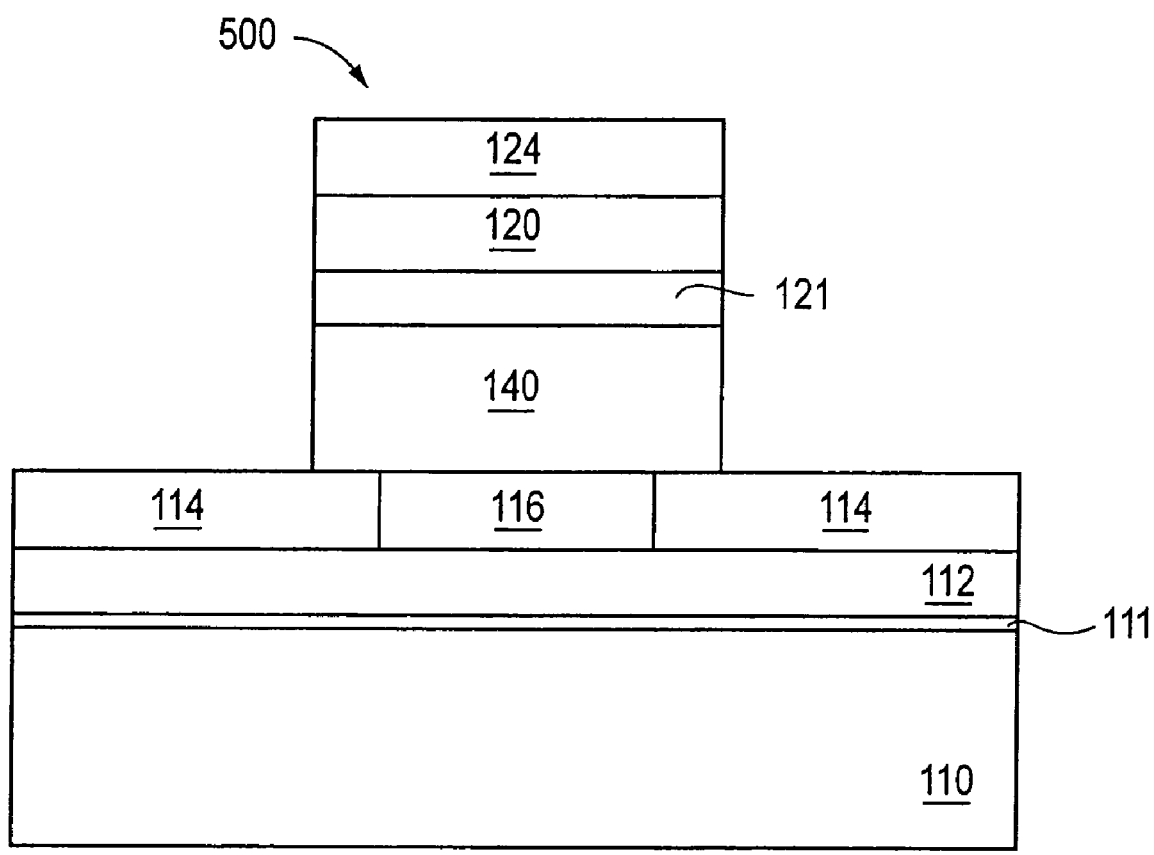
FIG. 5 illustrates a cross sectional view of a portion of a memory element according to another exemplary embodiment of the invention.

FIG. 5 illustrates a memory element 500 according to another exemplary embodiment of the invention. The memory element 500 is similar to the memory element 100, except that the threshold device 120 and optional conductive layer 121 are formed over the memory portion 140. The element 500 can be formed as described above in connection with FIGS. 3A-3D, except that the layers 141, 142, 143, 121, 120 (120a, 120b, 120c, 120d, 120e) are formed in a different order to achieve the structure shown in FIG. 5.

The embodiments described above refer to the formation of only a few possible resistance variable memory element structures in accordance with the invention, which may be part of a memory array. It must be understood, however, that the invention contemplates the formation of other memory structures within the spirit of the invention, which can be fabricated as a memory array and operated with memory element access circuits.

Figure 6:
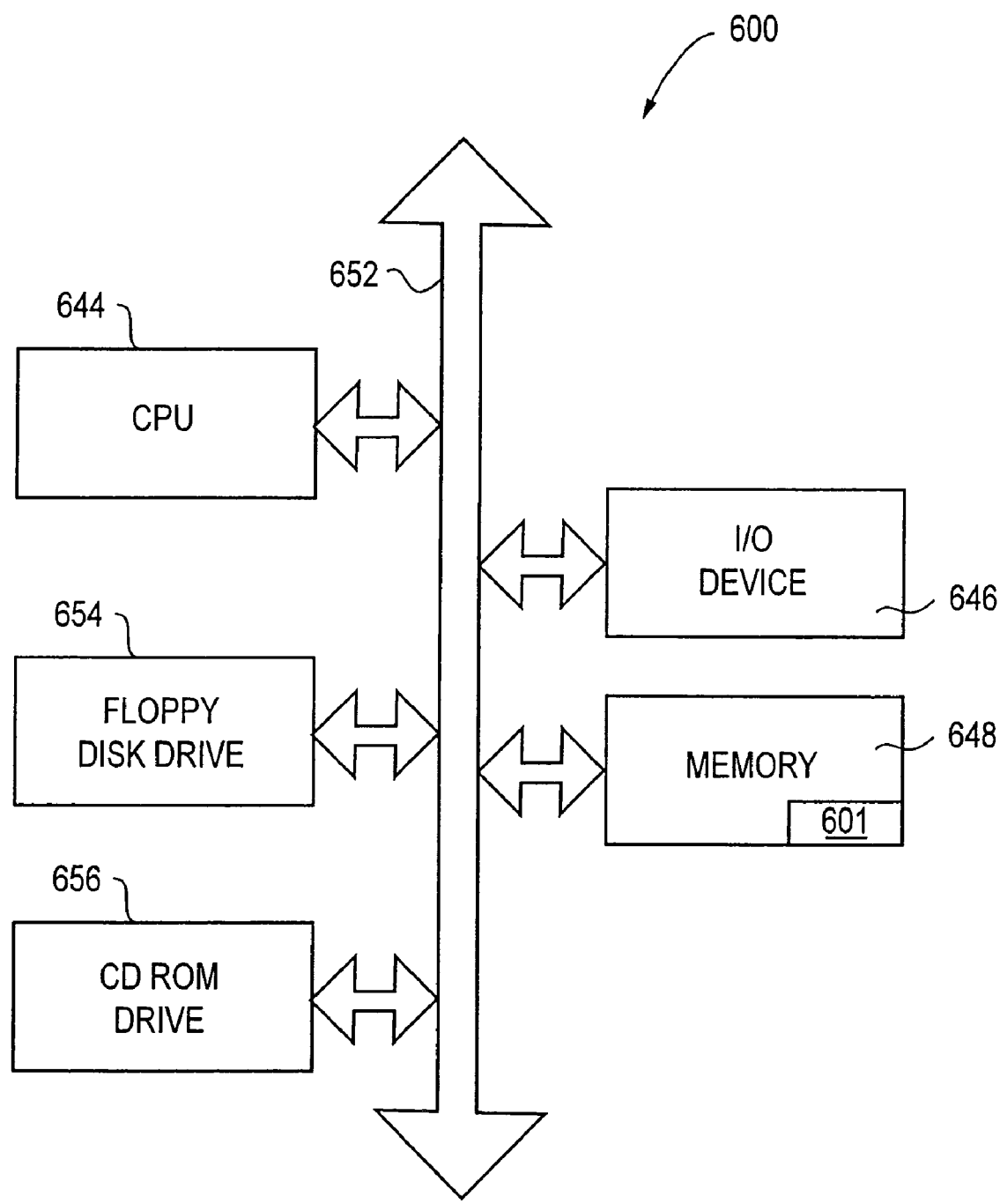
FIG. 6 is a block diagram of a system including a memory element according to an exemplary embodiment of the invention.

FIG. 6 illustrates a processor system 600 that includes a memory circuit 648, e.g., a memory device, including a memory array 601, which employs resistance variable memory elements (e.g., elements 100, 400, and/or 500) according to the invention. The processor system 600, which can be, for example, a computer system, generally comprises a central processing unit (CPU) 644, such as a microprocessor, a digital signal processor, or other programmable digital logic devices, which communicates with an input/output (I/O) device 646 over a bus 652. The memory circuit 648 communicates with the CPU 644 over bus 652 typically through a memory controller.

In the case of a computer system, the processor system 600 may include peripheral devices such as a floppy disk drive 654 and a compact disc (CD) ROM drive 656, which also communicate with CPU 644 over the bus 652. Memory circuit 648 is preferably constructed as an integrated circuit, which includes one or more resistance variable memory elements, e.g., elements 100 (FIG. 1). If desired, the memory circuit 648 may be combined with the processor, for example CPU 644, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

The invention claimed is:

1. A method of forming a memory element, the method comprising the acts of:
    forming a first electrode;
    forming a second electrode;
    forming a memory portion between the first electrode and the second electrode, the memory portion formed comprising at least one layer of resistance variable material; and
    forming a threshold device between the first electrode and the second electrode and connected to the memory portion, the threshold device configured to switch from a high resistance state to a low resistance state upon application of a voltage and, when the voltage is removed, to re-assume the high resistance state, the threshold device further configured to switch in response to both negative and positive applied voltages across the first and second electrodes.

2. The method of claim 1, wherein the threshold device is configured to have a first threshold voltage in response to a positive voltage and a second threshold voltage in response to a negative voltage, and wherein a magnitude of the first threshold voltage is different than a magnitude of the second threshold voltage.

3. The method of claim 1, wherein the act of forming the threshold device comprises:
    forming first, second and third layers of germanium selenide;
    forming a layer of tin selenide between the first and second germanium selenide layers; and
    forming a copper layer between the second and third germanium selenide layers.

4. The method of claim 3, wherein at least one of the germanium selenide layers is formed comprising $Ge_{60}Se_{40}$.

5. The method of claim 1, wherein the act of forming the memory portion comprises forming a chalcogenide material layer.

6. The method of claim 1, further comprising the act of forming a conductive layer between the memory portion and the threshold device.

7. The method of claim 3, wherein the conductive layer is formed comprising tungsten.

8. The method of claim 1, wherein the memory portion is formed over the threshold device.

9. The method of claim 1, wherein the threshold device is formed over the memory portion.

10. The method of claim 1, wherein at least one of the first and second electrodes is formed comprising tungsten.

11. The method of claim 1, wherein the memory portion and threshold device are formed within a via in an insulating layer.

12. A method of forming a memory element, the method comprising the acts of:
- forming a first electrode;
- forming a memory portion over the first electrode, the memory portion formed comprising at least one layer of resistance variable material;
- forming a threshold device over the memory portion, the act of forming the threshold device comprising:
  - forming a first layer of germanium selenide,
  - forming a layer of tin selenide over the first germanium selenide layer,
  - forming a second germanium selenide layer over the tin selenide layer,
  - forming a copper layer over the second germanium selenide layer; and
  - forming a third germanium selenide layer over the copper layer; and
- forming a second electrode over the threshold device.

13. The method of claim 12, wherein at least one of the germanium selenide layers is formed comprising $Ge_{60}Se_{40}$.

14. The method of claim 12, wherein the act of forming the memory portion comprises forming a chalcogenide material layer.

15. The method of claim 12, further comprising the act of forming a conductive layer between the memory portion and the threshold device.

16. The method of claim 15, wherein the conductive layer is formed comprising tungsten.

17. A method of forming a memory element, the method comprising the acts of:
- forming a first electrode;
- forming a threshold device over the first electrode, the act of forming the threshold device comprising:
  - forming a first layer of germanium selenide;
  - forming a layer of tin selenide over the first germanium selenide layer;
  - forming a second germanium selenide layer over the tin selenide layer;
  - forming a copper layer over the second germanium selenide layer; and
  - forming a third germanium selenide layer over the copper layer;
- forming a memory portion over the first electrode, the memory portion formed comprising at least one layer of resistance variable material; and
- forming a second electrode over the memory portion.

18. The method of claim 17, wherein at least one of the germanium selenide layers is formed comprising $Ge_{60}Se_{40}$.

19. The method of claim 17, wherein the act of forming the memory portion comprises forming a chalcogenide material layer.

20. The method of claim 17, further comprising the act of forming a conductive layer between the memory portion and the threshold device.

21. The method of claim 20, wherein the conductive layer is formed comprising tungsten.

* * * * *

UNITED STATES PATENT AND TRADEMARK OFFICE
CERTIFICATE OF CORRECTION

| | | |
|---|---|---|
| PATENT NO. | : 7,289,349 B2 | Page 1 of 1 |
| APPLICATION NO. | : 11/601747 | |
| DATED | : October 30, 2007 | |
| INVENTOR(S) | : Campbell et al. | |

It is certified that error appears in the above-identified patent and that said Letters Patent is hereby corrected as shown below:

In column 8, line 62, in Claim 7, delete "claim 3," and insert -- claim 1, --, therefor.

Signed and Sealed this

Fourth Day of March, 2008

JON W. DUDAS
*Director of the United States Patent and Trademark Office*